(12) United States Patent
Isono

(10) Patent No.: US 7,292,672 B2
(45) Date of Patent: Nov. 6, 2007

(54) REGISTER CIRCUIT, AND SYNCHRONOUS INTEGRATED CIRCUIT THAT INCLUDES A REGISTER CIRCUIT

(75) Inventor: Takanori Isono, Joyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 142 days.

(21) Appl. No.: 11/231,801

(22) Filed: Sep. 22, 2005

(65) Prior Publication Data
US 2006/0082400 A1 Apr. 20, 2006

(30) Foreign Application Priority Data
Oct. 19, 2004 (JP) ............................. 2004-304463

(51) Int. Cl.
*G11C 19/00* (2006.01)
*H03K 3/289* (2006.01)
(52) U.S. Cl. .................... 377/64; 327/202; 327/203; 327/218
(58) Field of Classification Search ................ 327/202, 327/203, 208–212, 218; 377/64, 69, 73–74, 377/79
See application file for complete search history.

(56) References Cited

U.S. PATENT DOCUMENTS

| 5,883,529 | A | 3/1999 | Kumata et al. |
|---|---|---|---|
| 6,097,230 | A * | 8/2000 | Bareither ..................... 327/202 |
| 6,998,896 | B1 * | 2/2006 | De La Cruz et al. ........ 327/202 |
| 7,023,058 | B2 * | 4/2006 | Kanno et al. ................ 257/371 |
| 7,049,871 | B2 * | 5/2006 | Tohsche ..................... 327/197 |

* cited by examiner

*Primary Examiner*—Tuan T Lam
(74) *Attorney, Agent, or Firm*—McDermott Will & Emery LLP

(57) ABSTRACT

A register circuit includes a passage control circuit and a holding circuit. The passage control circuit includes a first transistor having a gate to which a clock signal is input, a second transistor having a gate to which a data signal is input, and a third transistor having a gate to which a control signal is input, with source-drain paths of the first, second, and third transistors being connected in series. The passage control circuit enables passage of the data signal to the holding circuit according to a state of the clock signal when the control signal is in one of an active state and an inactive state, and disables passage of the data signal to the holding circuit when the control signal is in the other one of the active state and the inactive state. The holding circuit latches the data signal passed from the passage control circuit.

9 Claims, 15 Drawing Sheets

1B

102

Prior Art

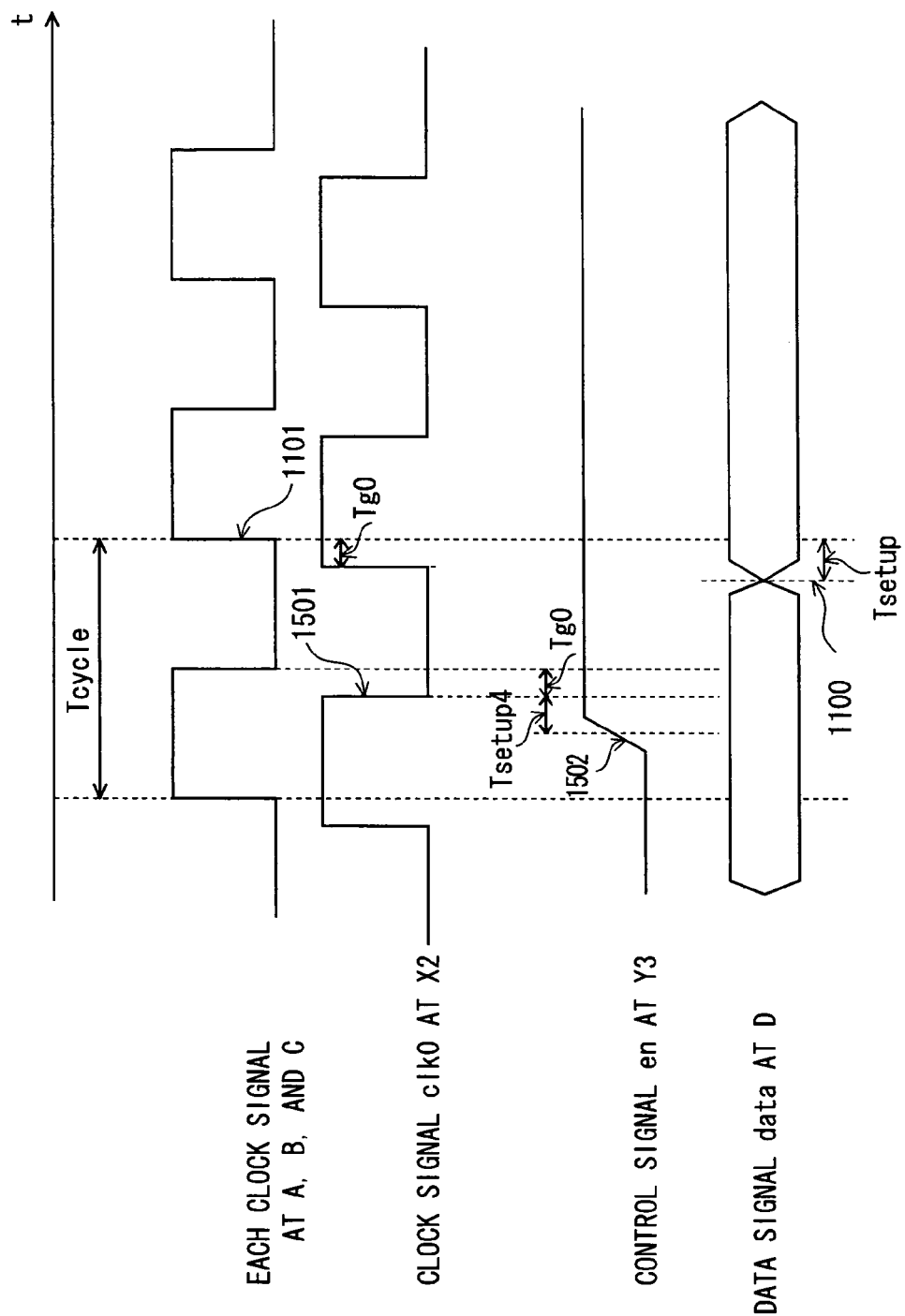

US 7,292,672 B2

REGISTER CIRCUIT, AND SYNCHRONOUS INTEGRATED CIRCUIT THAT INCLUDES A REGISTER CIRCUIT

This application is based on an application No. 2004-304463 filed in Japan, the contents of which are hereby incorporated by reference.

BACKGROUND OF THE INVENTION

1. Field of the Invention

The present invention relates to a register circuit used in a synchronous integrated circuit that adopts clock gating, and especially relates to techniques for improving an operating frequency of the synchronous integrated circuit.

2. Related Art

Clock gating (also referred to as "gated clock") is one of the techniques used for reducing power consumption of an integrated circuit.

To save power, clock gating stops supply of a clock signal to a circuit which is not operating, among a plurality of circuits that constitute the integrated circuit.

Conventional clock gating techniques typically use a logic cell, such as an AND circuit or an OR circuit, to control supply of a clock signal to a circuit. Such a logic cell used for clock gating is hereafter called a gated cell.

A conventional synchronous integrated circuit having a gated cell is described below.

FIG. 10 schematically shows a conventional synchronous integrated circuit 100 having a gated cell.

In the drawing, the synchronous integrated circuit 100 includes a register 101 that is subjected to clock signal supply control, an AND circuit 102 as a gated cell, registers 103 and 104, combinational circuits 105 and 106, a clock signal generation circuit 107, and buffers 111 and 112.

The clock signal generation circuit 107 outputs clock signal clk0, which is fed to the AND circuit 102 and the buffers 111 and 112 via a clock signal line 110.

The buffer 111 receives clock signal clk0, and outputs clock signal clk3 to the register 104.

The buffer 112 receives clock signal clk0, and outputs clock signal clk2 to the register 103.

The combinational circuit 105 outputs data signal data, which is fed to the register 101 via a data signal line 108.

The combinational circuit 106 outputs control signal en used for controlling supply of a clock signal to the register 101. Control signal en is fed to the AND circuit 102 via a control signal line 109.

The AND circuit 102 receives control signal en and clock signal clk0, and outputs clock signal clk1. FIG. 12 is a circuit diagram of the AND circuit 102.

The AND circuit 102 has a phase delay of time Tg between the signal input and the signal output.

The registers 101, 103, and 104 are each a master-slave flip-flop circuit.

FIG. 13 is a circuit diagram of the register 101.

The register 101 includes a passage control circuit 101a and a holding circuit 101b that constitute a master latch circuit, a passage control circuit 101c and a holding circuit 101d that constitute a slave latch circuit, and a clock signal inverter circuit 101e. The register 101 receives data signal data and clock signal clk1, and outputs latched data signal Q.

FIG. 11 is a timing chart of each signal at points A, B, C, D, X, and Y shown in FIG. 10.

In detail, clock signal clk1 is detected at point A, clock signal clk2 at point B, clock signal clk3 at point C, data signal data at point D, clock signal clk0 at point X, and control signal en at point Y.

As shown in FIG. 11, clock signals clk1, clk2, and clk3 detected respectively at points A, B, and C are in phase with each other.

There is a phase delay of time Tg between the input of clock signal clk0 to the AND circuit 102 and the output of clock signal clk1 from the AND circuit 102. Which is to say, clock signal clk0 leads in phase clock signal clk1 by delay time Tg. This being so, clock skew is adjusted by inserting the buffers 111 and 112 in branch lines of the clock signal line 110 so as to bring clock signals clk1, clk2, and clk3 input respectively to the registers 101, 103, and 104 into phase with each other.

Data signal data is set so that the beginning 1100 of data to be latched in the register 101 reaches the register 101 at least setup time Tsetup before a leading edge 1101 of clock signal clk1 input to the register 101.

Also, control signal en is set so that its trailing edge 1103 reaches the AND circuit 102 at least setup time Tsetup1 before a leading edge 1102 of clock signal clk0, in order to prevent clock signal clk1 from becoming high with the leading edge 1102 of clock signal clk0.

Clock cycle Tcycle is determined in accordance with a delay of a critical path, i.e. a path between registers that has a largest delay, in the synchronous integrated circuit 100.

A delay of a path between registers is a sum total of a wire propagation delay, an input/output delay of each circuit located between the registers, and a setup time of each circuit located between the registers. For example, a delay of a path between the registers 104 and 101 is Ten+Tsetup1+Tg, where Ten denotes a delay time of control signal en (wire propagation delay).

In the synchronous integrated circuit 100, the path between the registers 104 and 101 can be assumed to be the critical path. This being the case, clock cycle Tcycle is set so that Tcycle≧Ten+Tsetup1+Tg. This means if Ten+Tsetup1+Tg is smaller, clock cycle Tcycle can be reduced, with it being possible to improve an operating frequency of the synchronous integrated circuit 100.

SUMMARY OF THE INVENTION

In view of the above, the present invention aims to provide a register circuit with which a delay of a path between registers on which control signal en travels can be reduced when compared with conventional clock gating that uses a gated cell. The present invention also aims to provide a synchronous integrated circuit including the register circuit.

The stated aim can be achieved by a register circuit including a passage control circuit and a holding circuit, wherein the passage control circuit includes a first transistor having a gate to which a clock signal is input, a second transistor having a gate to which a data signal is input, and a third transistor having a gate to which a control signal is input, a source-drain path of the first transistor, a source-drain path of the second transistor, and a source-drain path of the third transistor are connected in series, the passage control circuit enables passage of the data signal to the holding circuit according to a state of the clock signal when the control signal is in a first state that is one of an active state and an inactive state, and disables passage of the data signal to the holding circuit when the control signal is in a second state that is different from the first state, and the holding circuit latches the data signal passed from the passage control circuit.

The stated aim can also be achieved by a synchronous integrated circuit including: a register circuit including a passage control circuit and a holding circuit, wherein the passage control circuit includes a first transistor having a gate to which a clock signal is input, a second transistor having a gate to which a data signal is input, and a third transistor having a gate to which a control signal is input, a source-drain path of the first transistor, a source-drain path of the second transistor, and a source-drain path of the third transistor are connected in series, the passage control circuit enables passage of the data signal to the holding circuit according to a state of the clock signal when the control signal is in a first state that is one of an active state and an inactive state, and disables passage of the data signal to the holding circuit when the control signal is in a second state that is different from the first state, and the holding circuit latches the data signal passed from the passage control circuit; a clock signal generation circuit operable to generate the clock signal; and a combinational circuit operable to generate the control signal, wherein the gate of the first transistor in the register circuit is connected with the clock signal generation circuit via a clock signal line, and the gate of the third transistor in the register circuit is connected with the combinational circuit via a control signal line.

By applying the above register construction to a register circuit that is subjected to clock signal supply control in a synchronous integrated circuit, clock gating can be performed without using a gated cell. As a result, a delay of a path between registers on which the control signal travels can be reduced by a delay time caused by the presence of the gated cell. This means if the path between the registers on which the control signal travels is a critical path of the synchronous integrated circuit, the delay of the critical path is reduced by the delay time caused by the presence of the gated cell. As a result, an operating frequency of the synchronous integrated circuit can be improved.

Here, the holding circuit may include a fourth transistor having a gate to which the data signal is input, a fifth transistor having a gate to which the clock signal is input, and a sixth transistor having a gate to which the control signal is input, wherein a source-drain path of the fifth transistor and a source-drain path of the sixth transistor are connected in parallel, and a source-drain path of the fourth transistor and the source-drain path of the fifth transistor are connected in series, and the holding circuit latches the data signal passed from the passage control circuit when the control signal is in the second state.

According to this construction, when the control signal is in the second state, the data signal is latched irrespective of the state of the clock signal.

Here, the register circuit may be a master-slave flip-flop circuit which has a master latch circuit and a slave latch circuit, wherein the passage control circuit and the holding circuit are included in the slave latch circuit.

According to this construction, when compared with a conventional synchronous integrated circuit that uses an AND circuit as a gated cell, the delay of the path between the registers on which the control signal travels can be reduced by a delay time caused by the presence of the AND circuit.

Here, the register circuit may be a master-slave flip-flop circuit which has a master latch circuit and a slave latch circuit, wherein the passage control circuit and the holding circuit are included in the master latch circuit.

According to this construction, when compared with a conventional synchronous integrated circuit that uses an OR circuit as a gated cell, the delay of the path between the registers on which the control signal travels can be reduced by a delay time caused by the presence of the OR circuit.

Here, the source-drain path of the first transistor, the source-drain path of the second transistor, and the source-drain path of the third transistor may be connected in series in the stated order, with a drain of the first transistor being connected with a source of the second transistor and a drain of the second transistor being connected with a source of the third transistor.

According to this construction, the third transistor which has the control signal as the gate input is allowed to have a delay in switch timing with respect to the first and second transistors. This widens a range within which the control signal can be delayed.

The stated aim can also be achieved by a synchronous integrated circuit including: register circuits each including a passage control circuit and a holding circuit, wherein the passage control circuit includes a first transistor having a gate to which a clock signal is input, a second transistor having a gate to which a data signal is input, and a third transistor having a gate to which a control signal is input, a source-drain path of the first transistor, a source-drain path of the second transistor, and a source-drain path of the third transistor are connected in series, the passage control circuit enables passage of the data signal to the holding circuit according to a state of the clock signal when the control signal is in a first state that is one of an active state and an inactive state, and disables passage of the data signal to the holding circuit when the control signal is in a second state that is different from the first state, and the holding circuit latches the data signal passed from the passage control circuit, wherein a register circuit out of the register circuits is a master-slave flip-flop circuit which has a master latch circuit and a slave latch circuit with the passage control circuit and the holding circuit being included in the slave latch circuit, and an other register circuit out of the register circuits is a master-slave flip-flop circuit which has a master latch circuit and a slave latch circuit with the passage control circuit and the holding circuit being included in the master latch circuit; a clock signal generation circuit operable to generate the clock signal; and combinational circuits corresponding to the register circuits and each operable to generate the control signal for a corresponding one of the register circuits, wherein the gate of the first transistor in each of the register circuits is connected with the clock signal generation circuit via a clock signal line, and the gate of the third transistor in each of the register circuits is connected with a corresponding one of the combinational circuits via a control signal line.

According to this construction, different clock gating structures can be employed in different parts of the synchronous integrated circuit, with it being possible to reduce power consumption and improve an operating frequency. Such a synchronous integrated circuit can easily be designed as specified, so that design time is shortened when compared with conventional techniques.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings:

FIG. 15 is a timing chart of each signal at points A, B, C, D, X2, and Y3 shown in FIG. 14.

DESCRIPTION OF THE PREFERRED EMBODIMENTS

The following describes embodiments of the present invention with reference to drawings.

First Embodiment (Synchronous Integrated Circuit 10)

Figure 1:
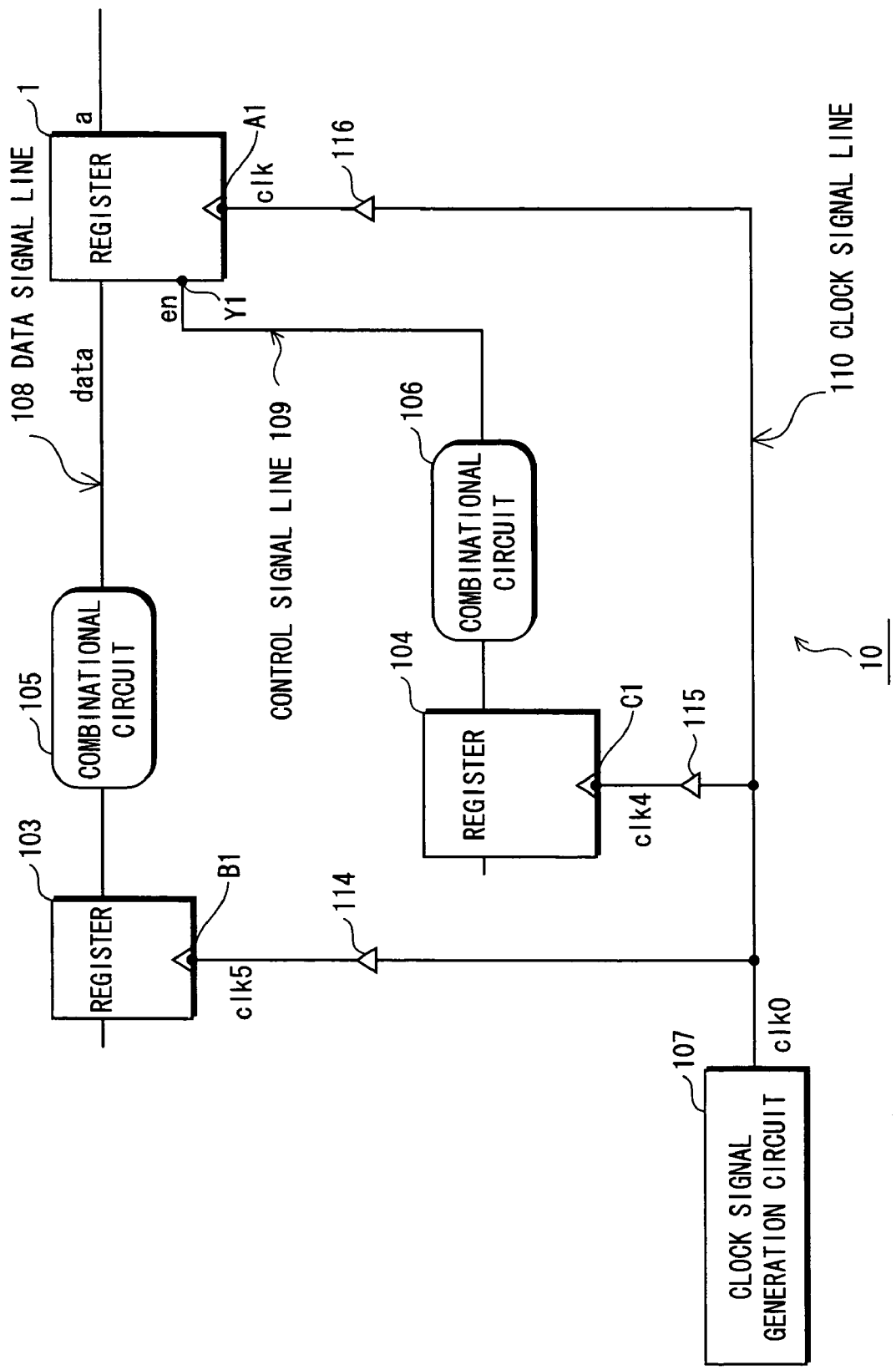
FIG. 1 schematically shows a synchronous integrated circuit to which a first embodiment of the present invention relates.

FIG. 1 schematically shows a synchronous integrated circuit 10 to which the first embodiment of the present invention relates.

In the drawing, the synchronous integrated circuit 10 includes a register 1 subjected to clock signal supply control, the registers 103 and 104, the combinational circuits 105 and 106, the clock signal generation circuit 107, and buffers 114, 115, and 116.

Figure 10:
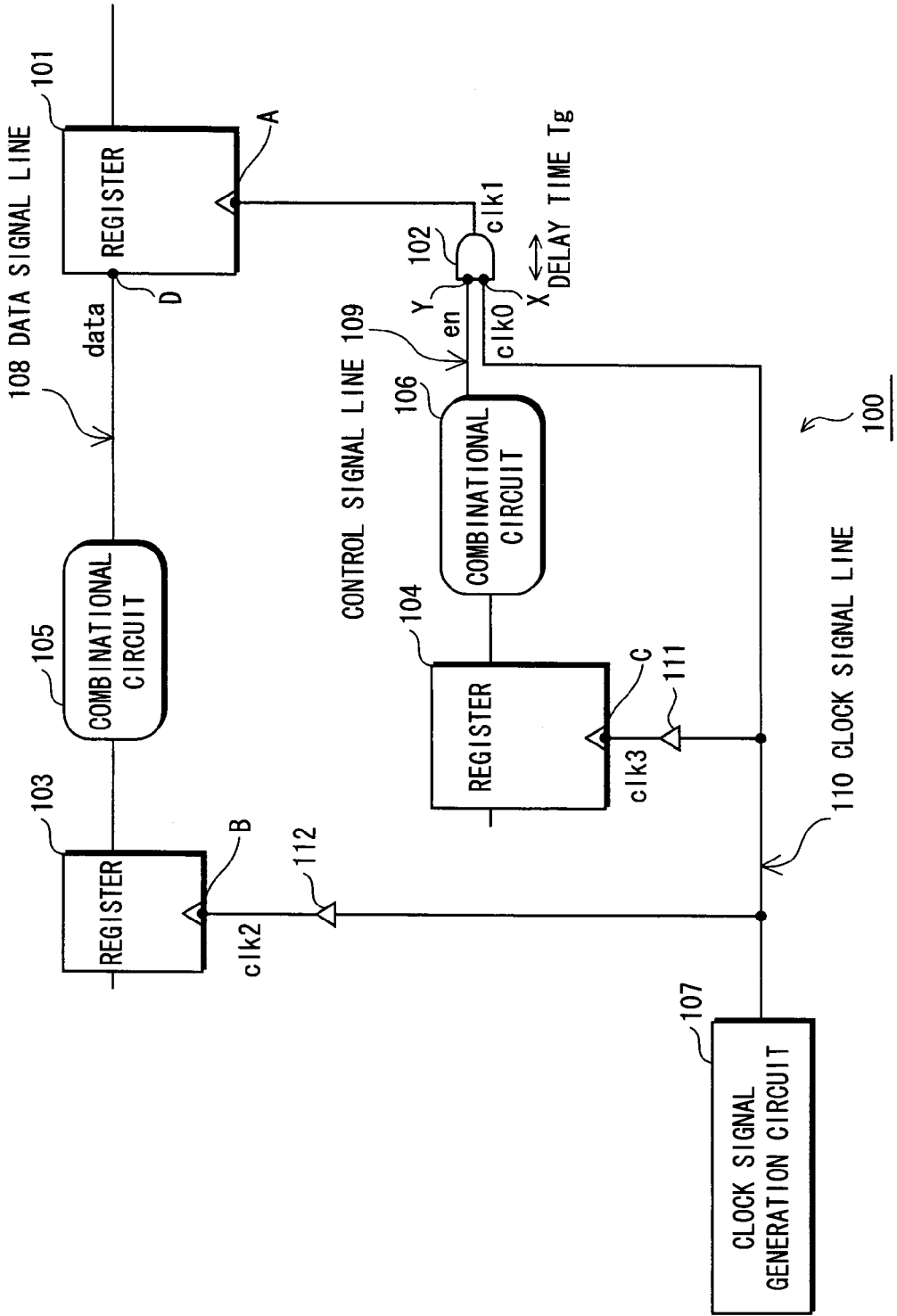
FIG. 10 schematically shows a conventional synchronous integrated circuit.
Figure 11:
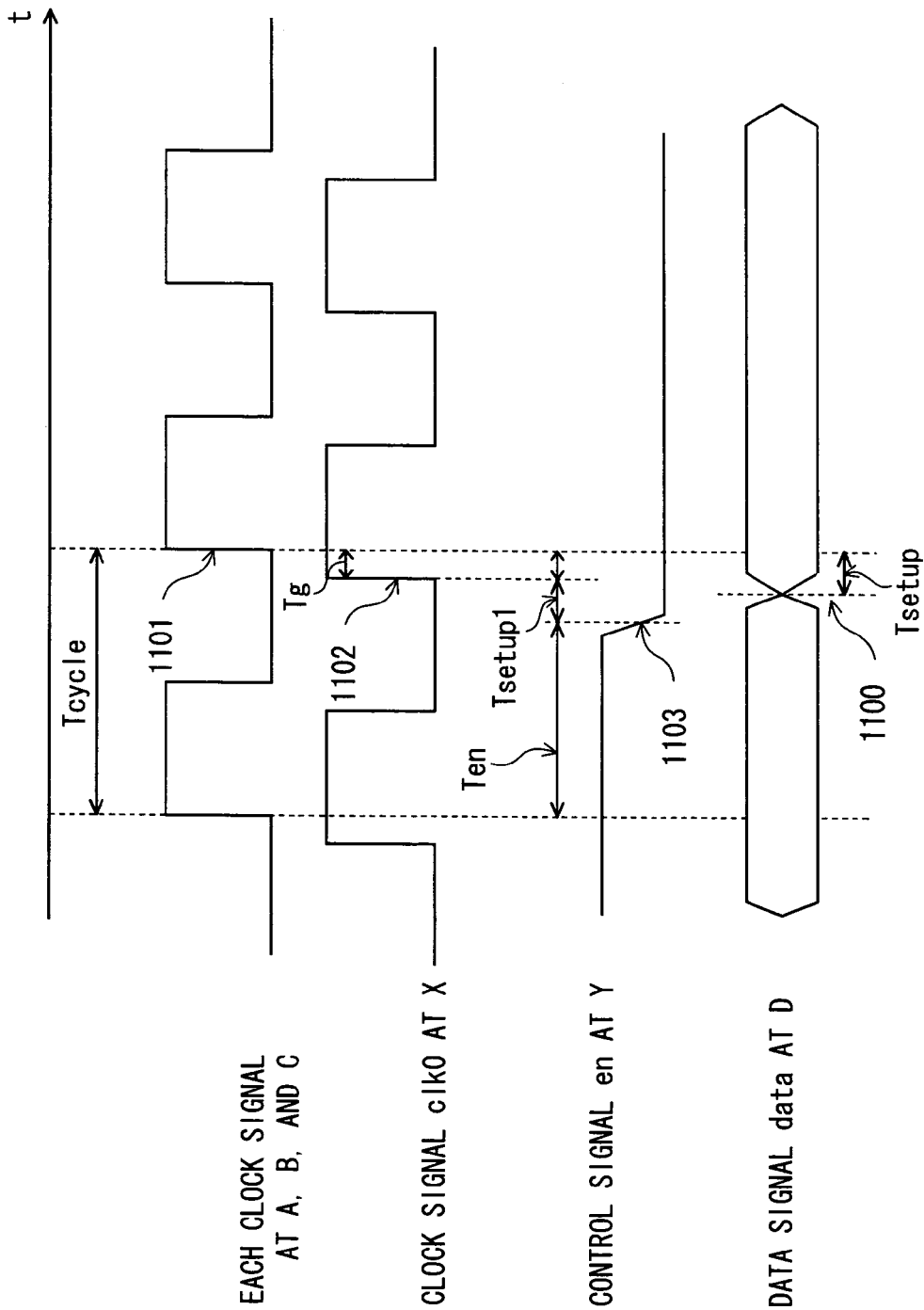
FIG. 11 is a timing chart of each signal at points A, B, C, D, X, and Y shown in FIG. 10.
Figure 12:
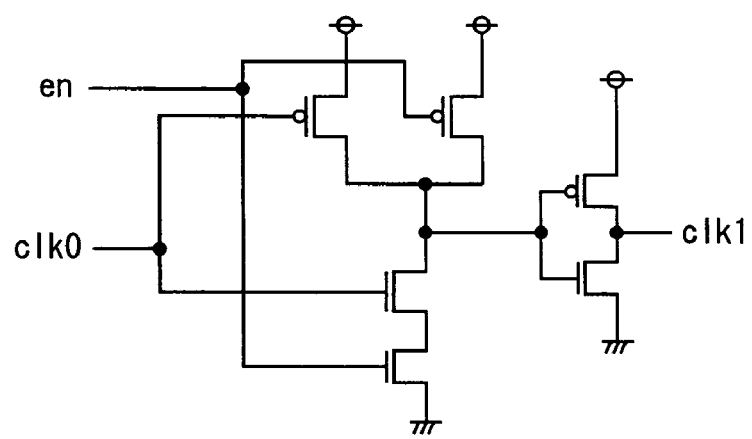
FIG. 12 is a circuit diagram of an AND circuit shown in FIG. 10.

The registers 103 and 104, the combinational circuits 105 and 106, and the clock signal generation circuit 107 are the same as the components having the same reference numerals in the conventional synchronous integrated circuit 100 shown in FIG. 10.

The synchronous integrated circuit 10 differs from the synchronous integrated circuit 100 in the following three points: the register 1 is provided as a circuit subjected to clock signal supply control; an AND circuit as a gated cell is not provided on the clock signal line 110 between the clock signal generation circuit 107 and the register 1; and the control signal line 109 is directly connected to the register 1.

The clock signal generation circuit 107 outputs clock signal clk0, which is fed to the buffers 114, 115, and 116 via the clock signal line 110.

The buffer 114 receives clock signal clk0 output from the clock signal generation circuit 107, and outputs clock signal clk5 to the register 103.

The buffer 115 receives clock signal clk0 output from the clock signal generation circuit 107, and outputs clock signal clk4 to the register 104.

The buffer 116 receives clock signal clk0 output from the clock signal generation circuit 107, and outputs clock signal clk to the register 1.

The combinational circuit 105 outputs data signal data, which is fed to the register 1 via the data signal line 108.

The combinational circuit 106 outputs control signal en used for controlling supply of a clock signal to the register 1. Control signal en is fed to the register 1 via the control signal line 109.

(Register 1)

Figure 2:
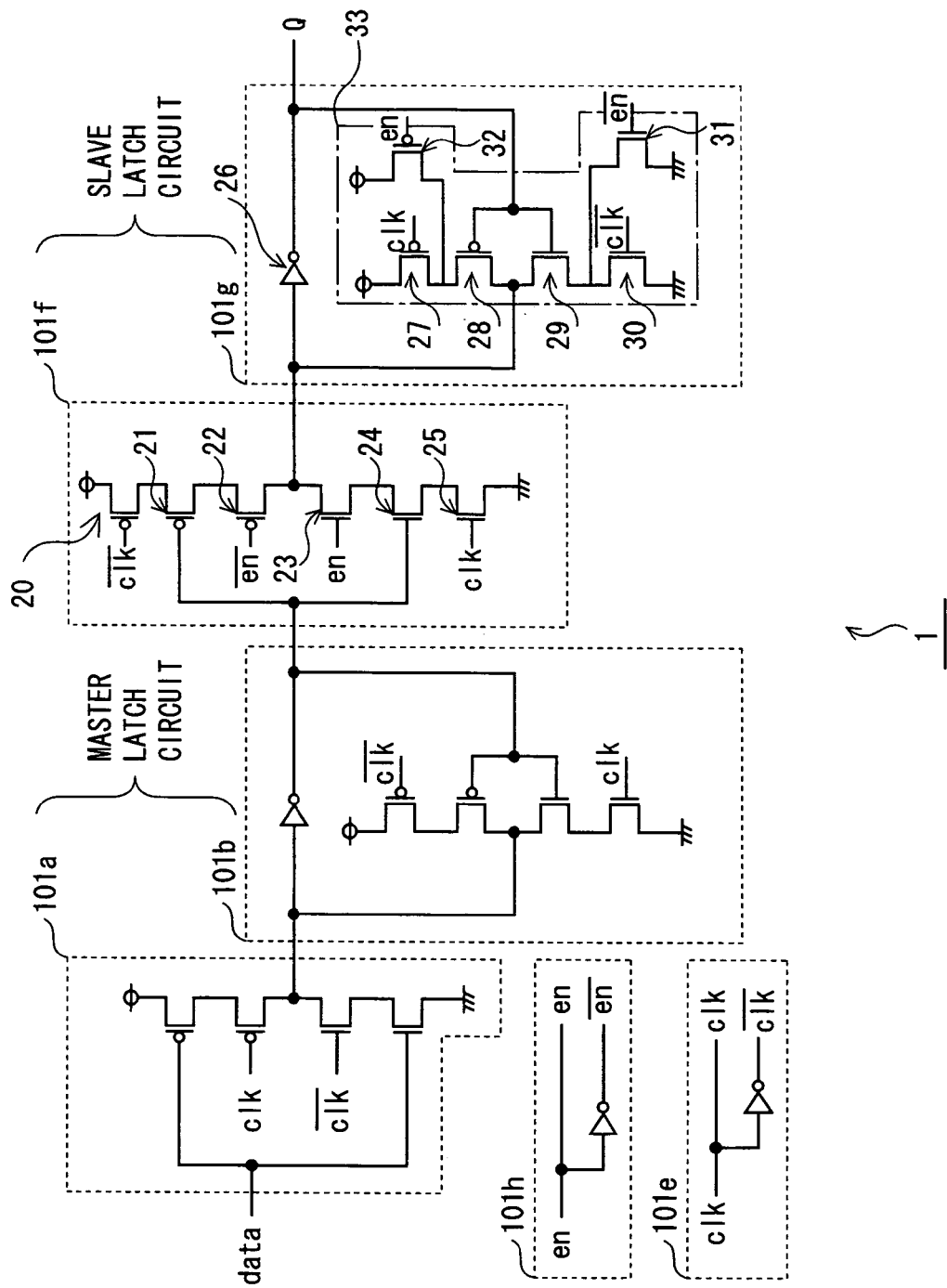
FIG. 2 is a circuit diagram of a register subjected to clock signal supply control in the synchronous integrated circuit shown in FIG. 1.

FIG. 2 is a circuit diagram of the register 1.

The register 1 is a master-slave flip-flop circuit, and includes the passage control circuit 101a and the holding circuit 101b that constitute a master latch circuit, a passage control circuit 101f and a holding circuit 101g that constitute a slave latch circuit, the clock signal inverter circuit 101e, and a control signal inverter circuit 101h.

The register 1 receives data signal data, clock signal clk, and control signal en, and outputs latched data signal Q.

Figure 13:
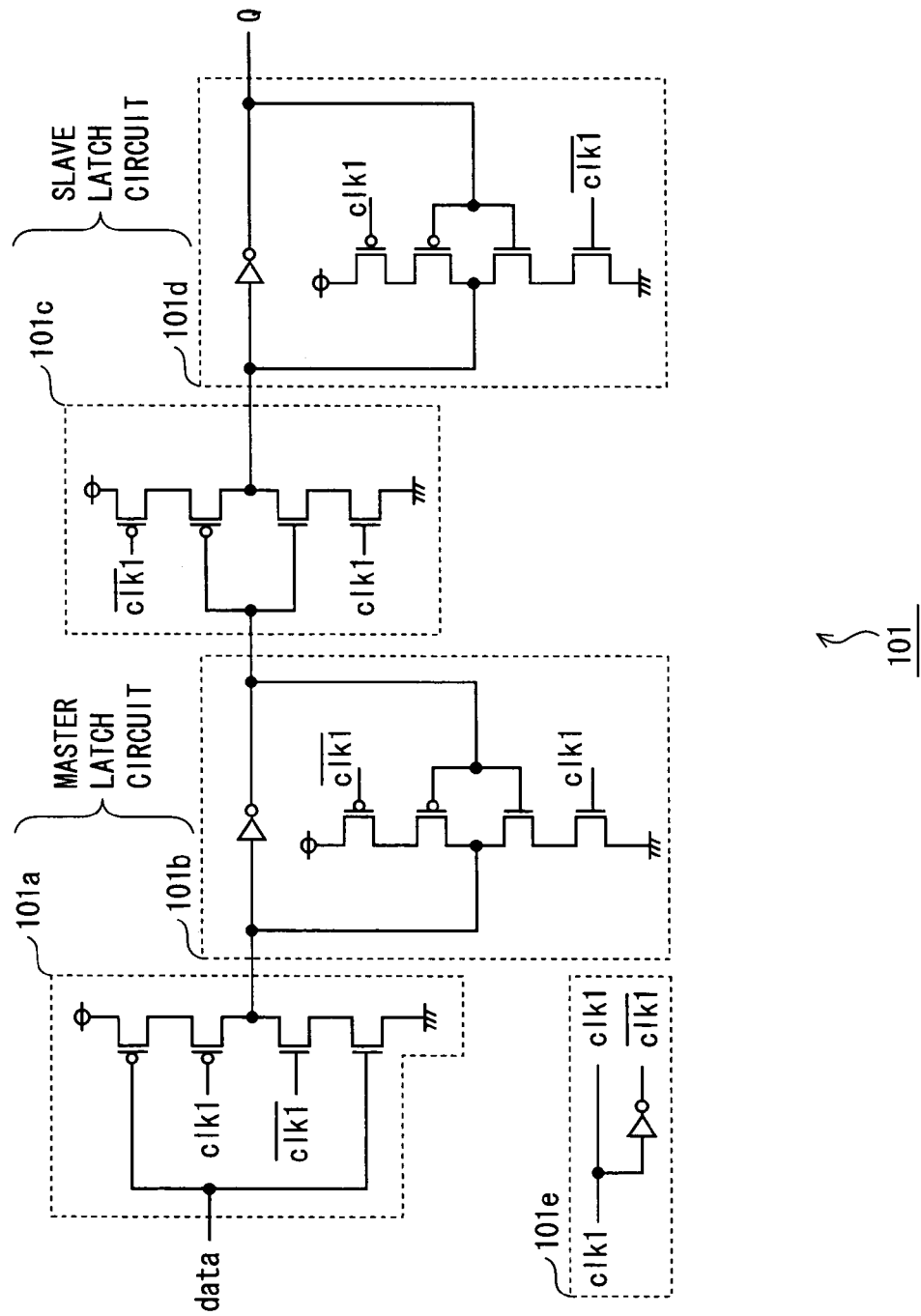
FIG. 13 is a circuit diagram of a register subjected to clock signal supply control in the conventional synchronous integrated circuit shown in FIG. 10.

The master latch circuit in the register 1 has the same construction as the master latch circuit in the register 101 shown in FIG. 13. The register 1 differs from the register 101 in the construction of the slave latch circuit and the addition of the control signal inverter circuit 101h.

(Passage Control Circuit 101f)

The passage control circuit 101f is a CMOS (Complementary Metal-Oxide Semiconductor) circuit in which source-drain paths of p-channel MOS transistors 20, 21, and 22 and n-channel MOS transistors 23, 24, and 25 are connected in series.

A gate of the p-channel MOS transistor 20 has an input of inverted clock signal clk-bar output from the clock signal inverter circuit 101e.

A gate of the p-channel MOS transistor 21 has an input of data signal Q output from the holding circuit 101b in the master latch circuit.

A gate of the p-channel MOS transistor 22 has an input of inverted control signal en-bar output from the control signal inverter circuit 101h.

A gate of the n-channel MOS transistor 23 has an input of control signal en.

A gate of the n-channel MOS transistor 24 has an input of data signal Q output from the holding circuit 101b in the master latch circuit.

A gate of the n-channel MOS transistor 25 has an input of clock signal clk.

The passage control circuit 101f differs from the passage control circuit 101c shown in FIG. 13, in that the n-channel MOS transistor 23 having control signal en as a gate input and the p-channel MOS transistor 22 having inverted control signal en-bar as a gate input are included.

This passage control circuit 101f operates in the following manner.

When inverted clock signal clk-bar input to the gate of the p-channel MOS transistor 20 and inverted control signal en-bar input to the gate of the p-channel MOS transistor 22 are both inactive, data signal Q input to the gates of the p-channel MOS transistor 21 and n-channel MOS transistor 24 passes the passage control circuit 101*f* as inverted data signal Q-bar. During this time, clock signal clk input to the gate of the n-channel MOS transistor 25 and control signal en input to the gate of the n-channel MOS transistor 23 are both active. In this embodiment, an active state is a state where a voltage level of a signal is high, whereas an inactive state is a state where the voltage level of the signal is low.

Inverted data signal Q-bar is then output to the holding circuit 101*g* from the source-drain paths of the p-channel MOS transistor 22 and n-channel MOS transistor 23.

When any of inverted clock signal clk-bar input to the gate of the p-channel MOS transistor 20 and inverted control signal en-bar input to the gate of the p-channel MOS transistor 22 is active, data signal Q input to the gates of the p-channel MOS transistor 21 and n-channel MOS transistor 24 does not pass the passage control circuit 101*f*. During this time, any of clock signal clk input to the gate of the n-channel MOS transistor 25 and control signal en input to the gate of the n-channel MOS transistor 23 is inactive.

Thus, when control signal en input to the register 1 makes an active to inactive transition, the passage control circuit 101*f* stops passing data signal Q input in the passage control circuit 101*f* to the holding circuit 101*g*, regardless of the state of clock signal clk.

(Holding Circuit 101*g*)

The holding circuit 101*g* is formed by connecting an inverter circuit 26 and a circuit 33 in a loop. The circuit 33 is a CMOS circuit in which source-drain paths of p-channel MOS transistors 27 and 28 and n-channel MOS transistors 29 and 30 are connected in series, source-drain paths of p-channel MOS transistors 27 and 32 are connected in parallel, and source-drain paths of n-channel MOS transistors 30 and 31 are connected in parallel.

The inverter circuit 26 inverts inverted data signal Q-bar output from the passage control circuit 101*f*, and outputs data signal Q.

A gate of the p-channel MOS transistor 27 has an input of clock signal clk.

A gate of the p-channel MOS transistor 28 has an input of data signal Q output from the inverter circuit 26.

A gate of the p-channel MOS transistor 32 has an input of control signal en.

A gate of the n-channel MOS transistor 29 has an input of data signal Q output from the inverter circuit 26.

A gate of the n-channel MOS transistor 30 has an input of inverted clock signal clk-bar output from the clock signal inverter circuit 101*e*.

A gate of the n-channel MOS transistor 31 has an input of inverted control signal en-bar output from the control signal inverter circuit 101*h*.

The holding circuit 101*g* differs from the holding circuit 101*d* shown in FIG. 13 in that the n-channel MOS transistor 31 having inverted control signal en-bar as a gate input and the p-channel MOS transistor 32 having control signal en as a gate input are included.

This holding unit 101*g* operates in the following manner.

When any of clock signal clk input to the gate of the p-channel MOS transistor 27 and control signal en input to the gate of the p-channel MOS transistor 32 is inactive, data signal Q output from the inverter circuit 26 to the gates of the p-channel MOS transistor 28 and n-channel MOS transistor 29 loops in the holding circuit 101*g*. Which is to say, the holding circuit 101*g* latches data signal Q. During this time, any of inverted clock signal clk-bar input to the gate of the n-channel MOS transistor 30 and inverted control signal en-bar input to the gate of the n-channel MOS transistor 31 is active.

When clock signal clk input to the gate of the p-channel MOS transistor 27 and control signal en input to the gate of the p-channel MOS transistor 32 are both active, data signal Q output from the inverter circuit 26 does not loop in the holding circuit 101*g*. Which is to say, the holding circuit 101*g* does not latch data signal Q. During this time, inverted clock signal clk-bar input to the gate of the n-channel MOS transistor 30 and inverted control signal en-bar input to the gate of the n-channel MOS transistor 31 are both inactive.

Thus, when control signal en input to the register 1 makes an active to inactive transition, the holding circuit 101*g* latches data signal Q which has passed the passage control circuit 101*f*, irrespective of the state of clock signal clk.

(Effects)

Figure 3:
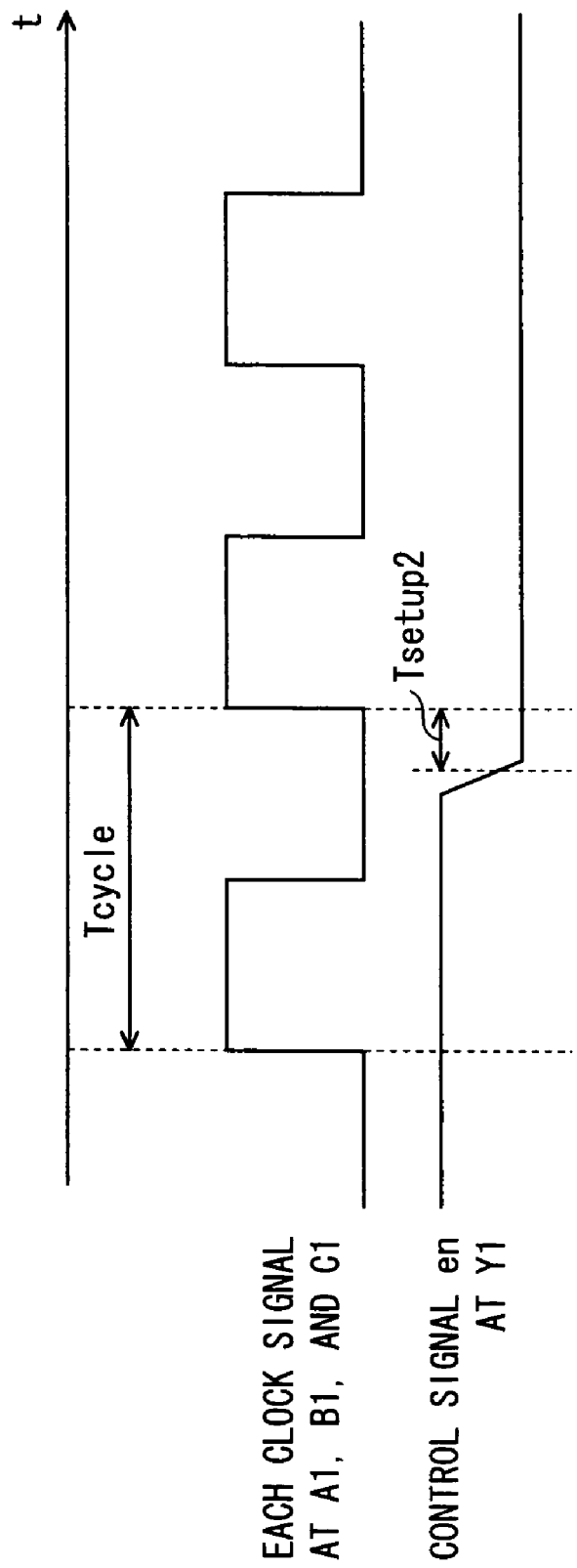
FIG. 3 is a timing chart of each signal at points A1, B1, C1, and Y1 shown in FIG. 1.

FIG. 3 is a timing chart of each signal at points A1, B1, C1, and Y1 shown in FIG. 1.

In detail, clock signal clk is detected at point A1, clock signal clk5 at Point B1, clock signal clk4 at point C1, and control signal en at point Y1.

A delay of a path between the register 104 and the register 1 is Ten+Tsetup2. When compared with the path delay Ten+Tsetup1+Tg between the register 104 and the register 101 in the conventional synchronous integrated circuit 100 that uses the AND circuit 102 as a gated cell, the path delay can be reduced by Tg. Note here that Tsetup1 and Tsetup2 are substantially equal.

Accordingly, if the path between the register 104 and the register 1 is a critical path of the synchronous integrated circuit 10, a delay of the critical path can be reduced when compared with the conventional synchronous integrated circuit 100. This contributes to a higher operating frequency of the synchronous integrated circuit 10.

Second Embodiment

In the first embodiment, the slave latch circuit latches data signal Q in the holding circuit 101*g* to thereby stop transitions of data signal Q, with an active to inactive transition of control signal en. Meanwhile, in the master latch circuit data signal Q transitions according to clock signal clk, which still causes a waste of power in the register 1.

The second embodiment of the present invention addresses this problem.

Figure 4:
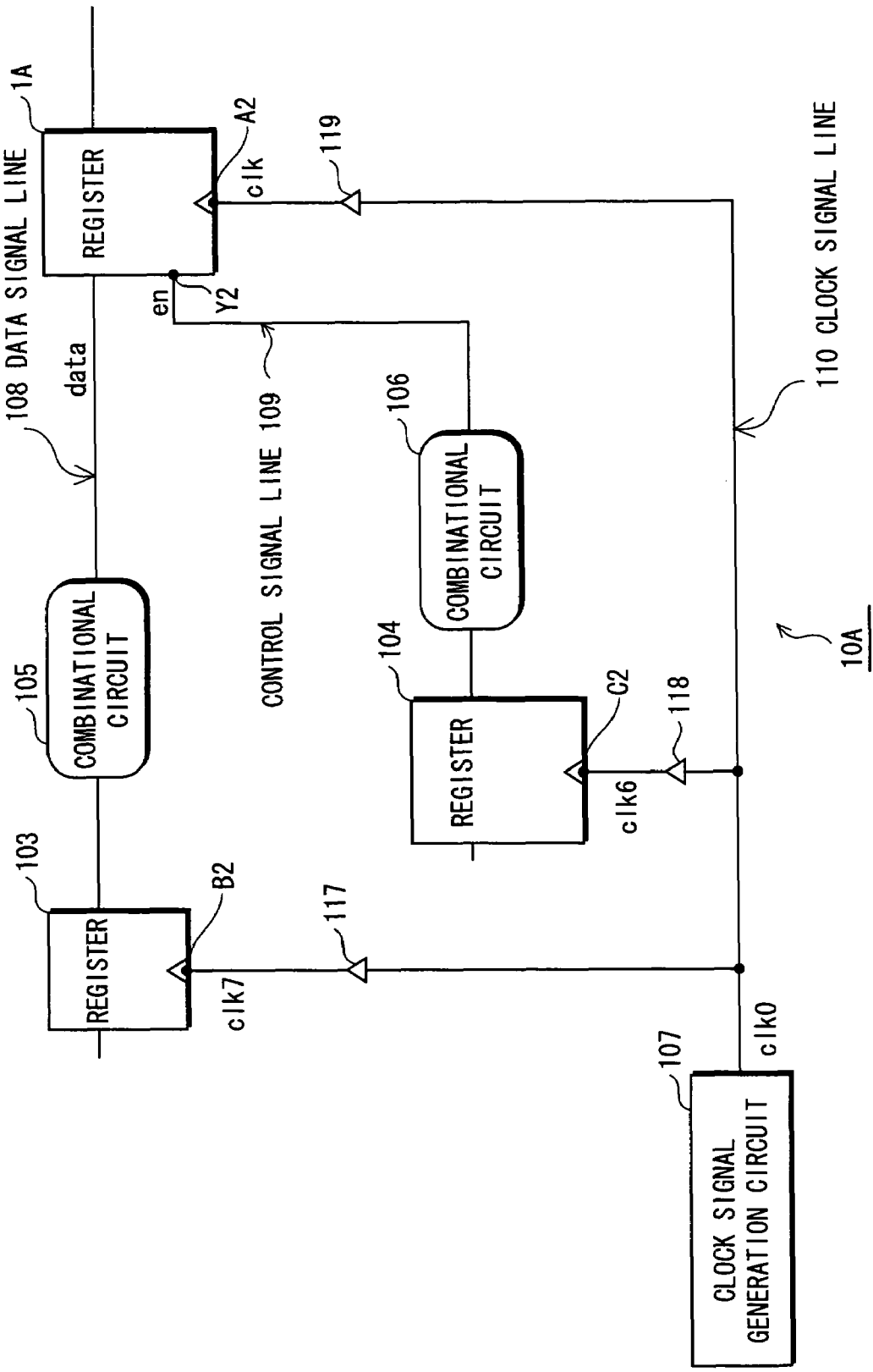
FIG. 4 schematically shows a synchronous integrated circuit to which a second embodiment of the present invention relates.

FIG. 4 schematically shows a synchronous integrated circuit 10A to which the second embodiment relates.

The synchronous integrated circuit 10A differs from the synchronous integrated circuit 10 of the first embodiment only in a register 1A and buffers 117, 118, and 119 used for clock skew adjustment.

The buffer 117 receives clock signal clk0 output from the clock signal generation circuit 107, and outputs clock signal clk7 to the register 103.

The buffer 118 receives clock signal clk0 output from the clock signal generation circuit 107, and outputs clock signal clk6 to the register 104.

The buffer 119 receives clock signal clk0 output from the clock signal generation circuit 107, and outputs clock signal clk to the register 1A.

(Register 1A)

Figure 5:
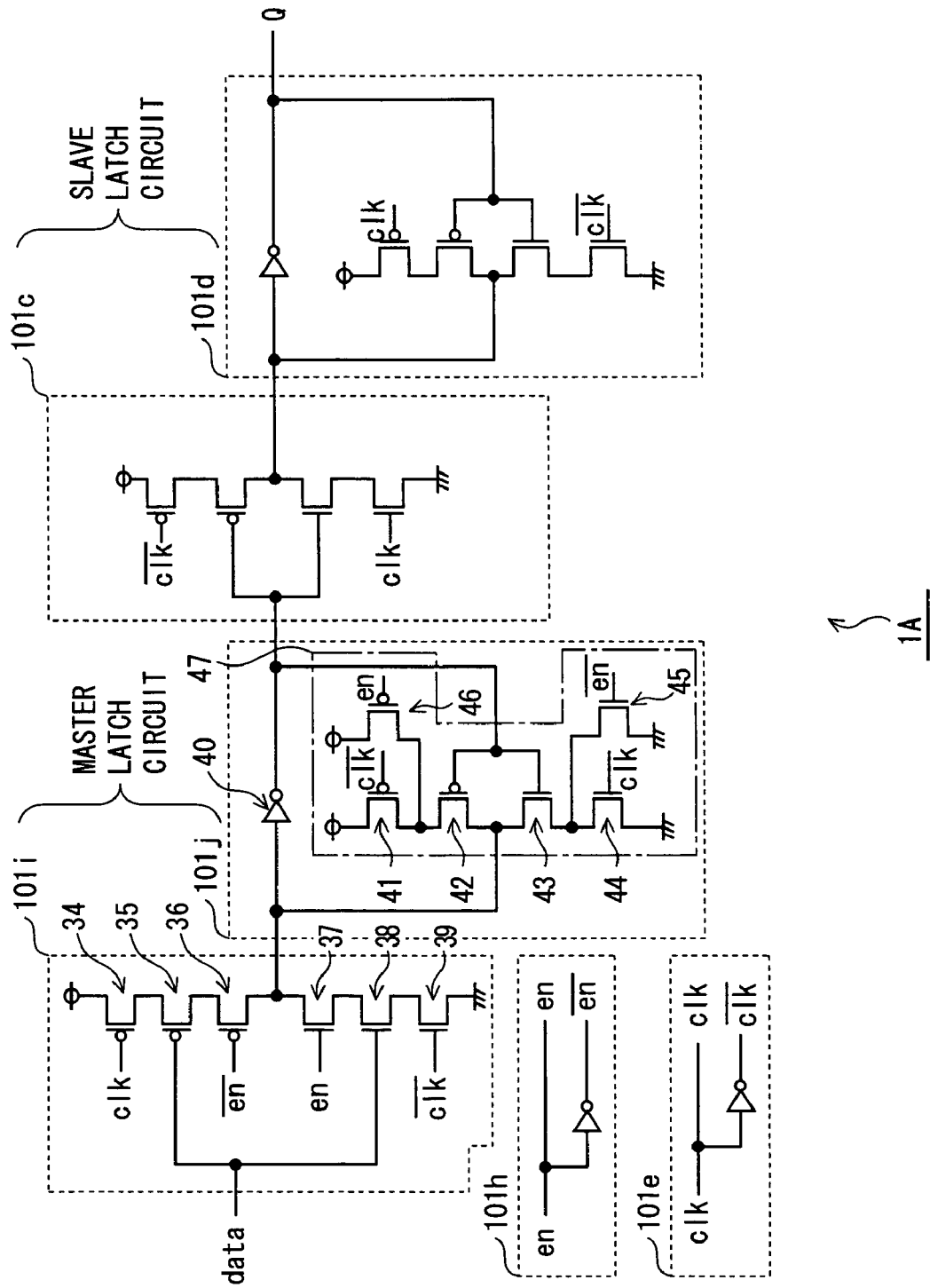
FIG. 5 is a circuit diagram of a register subjected to clock signal supply control in the synchronous integrated circuit shown in FIG. 4.

FIG. 5 is a circuit diagram of the register 1A.

The register 1A is a master-slave flip-flop circuit, and includes a passage control circuit 101*i* and a holding circuit 101j that constitute a master latch circuit, the passage control circuit 101c and the holding circuit 101d that constitute a slave latch circuit, the clock signal inverter circuit 101e, and the control signal inverter circuit 101h.

The slave latch circuit in the register 1A has the same construction as the slave latch circuit in the register 101 shown in FIG. 13. The register 1A differs from the register 101 in the construction of the master latch circuit and the addition of the control signal inverter circuit 101h.

(Passage Control Circuit 101i)

The passage control circuit 101i is a CMOS circuit in which source-drain paths of p-channel MOS transistors 34, 35, and 36 and n-channel MOS transistors 37, 38, and 39 are connected in series.

A gate of the p-channel MOS transistor 34 has an input of clock signal clk.

A gate of the p-channel MOS transistor 35 has an input of data signal data output from the combinational circuit 105.

A gate of the p-channel MOS transistor 36 has an input of inverted control signal en-bar output from the control signal inverter circuit 101h.

A gate of the n-channel MOS transistor 37 has an input of control signal en.

A gate of the n-channel MOS transistor 38 has an input of data signal data output from the combinational circuit 105.

A gate of the n-channel MOS transistor 39 has an input of inverted clock signal clk-bar output from the clock signal inverter circuit 101e.

The passage control circuit 101i differs from the passage control circuit 101a shown in FIG. 13 in that the n-channel MOS transistor 37 which has control signal en as a gate input and the p-channel MOS transistor 36 which has inverted control signal en-bar as a gate input are included.

This passage control circuit 101i operates in the following manner.

When clock signal clk input to the gate of the p-channel MOS transistor 34 and inverted control signal en-bar input to the gate of the p-channel MOS transistor 36 are both inactive, data signal data input to the gates of the p-channel MOS transistor 35 and n-channel MOS transistor 38 passes the passage control circuit 101i as inverted data signal data-bar. During this time, inverted clock signal clk-bar input to the gate of the n-channel MOS transistor 39 and control signal en input to the gate of the n-channel MOS transistor 37 are both active. In this embodiment, an active state is a state where a voltage level of a signal is high, and an inactive state is a state where the voltage level of the signal is low.

Inverted data signal data-bar is then output to the holding circuit 101j from the source-drain paths of the p-channel MOS transistor 36 and n-channel MOS transistor 37.

When any of clock signal clk input to the gate of the p-channel MOS transistor 34 and inverted control signal en-bar input to the gate of the p-channel MOS transistor 36 is active, data signal data input to the gates of the p-channel MOS transistor 35 and n-channel MOS transistor 38 does not pass the passage control circuit 101i. During this time, any of inverted clock signal clk-bar input to the gate of the n-channel MOS transistor 39 and control signal en input to the gate of the n-channel MOS transistor 37 is inactive.

Thus, when control signal en input in the register 1A makes an active to inactive transition, the passage control circuit 101i stops passing data signal data to the holding circuit 101j, irrespective of the state of clock signal clk.

(Holding Circuit 101j)

The holding circuit 101j is formed by connecting an inverter circuit 40 and a circuit 47 in a loop. The circuit 47 is a CMOS circuit in which source-drain paths of p-channel MOS transistors 41 and 42 and n-channel MOS transistors 43 and 44 are connected in series, source-drain paths of p-channel MOS transistors 41 and 46 are connected in parallel, and source-drain paths of n-channel MOS transistors 44 and 45 are connected in parallel.

The inverter circuit 40 inverts inverted data signal data-bar output from the passage control circuit 101i, and outputs data signal data.

A gate of the p-channel MOS transistor 41 has an input of inverted clock signal clk-bar output from the clock signal inverter circuit 101e.

A gate of the p-channel MOS transistor 42 has an input of data signal data output from the inverter circuit 40.

A gate of the p-channel MOS transistor 46 has an input of control signal en.

A gate of the n-channel MOS transistor 43 has an input of data signal data output from the inverter circuit 40.

A gate of the n-channel MOS transistor 44 has an input of clock signal clk.

A gate of the n-channel MOS transistor 45 has an input of inverted control signal en-bar output from the control signal inverter circuit 101h.

The holding circuit 101j differs from the holding circuit 101b shown in FIG. 13 in that the n-channel MOS transistor 45 having inverted control signal en-bar as a gate input and the p-channel MOS transistor 46 having control signal en as a gate input are included.

This holding circuit 101j operates in the following manner.

When any of inverted clock signal clk-bar input to the gate of the p-channel MOS transistor 41 and control signal en input to the gate of the p-channel MOS transistor 46 is inactive, data signal data output from the inverter circuit 40 to the gates of the p-channel MOS transistor 42 and n-channel MOS transistor 43 loops in the holding circuit 101j. Which is to say, the holding circuit 101j latches data signal data. During this time, any of clock signal clk input to the gate of the n-channel MOS transistor 44 and inverted control signal en-bar input to the gate of the n-channel MOS transistor 45 is active.

When inverted clock signal clk-bar input to the gate of the p-channel MOS transistor 41 and control signal en input to the gate of the p-channel MOS transistor 46 are both active, data signal data output from the inverter circuit 40 does not loop in the holding circuit 101j. Which is to say, the holding circuit 101j does not latch data signal data. During this time, clock signal clk input to the gate of the n-channel MOS transistor 44 and inverted control signal en-bar input to the gate of the n-channel MOS transistor 45 are both inactive.

Thus, when control signal en input in the register 1A makes an active to inactive transition, the holding circuit 101j latches data signal data which has passed the passage control circuit 101i, irrespective of the state of clock signal clk.

(Effects)

As described above, the master latch circuit latches data signal data in the holding circuit 101j to thereby stop transitions of data signal data, with an inactive to active transition of control signal en. Accordingly, the register 1A has smaller power consumption than the register 1.

To perform clock signal supply control through the use of the register 1A, however, a leading edge of control signal en needs to reach the register 1A before a trailing edge of clock signal clk. This means control signal en needs to reach the register 1A in the second embodiment at least half of clock cycle Tcycle earlier than control signal en reaches the register 1 in the first embodiment.

Figure 6:
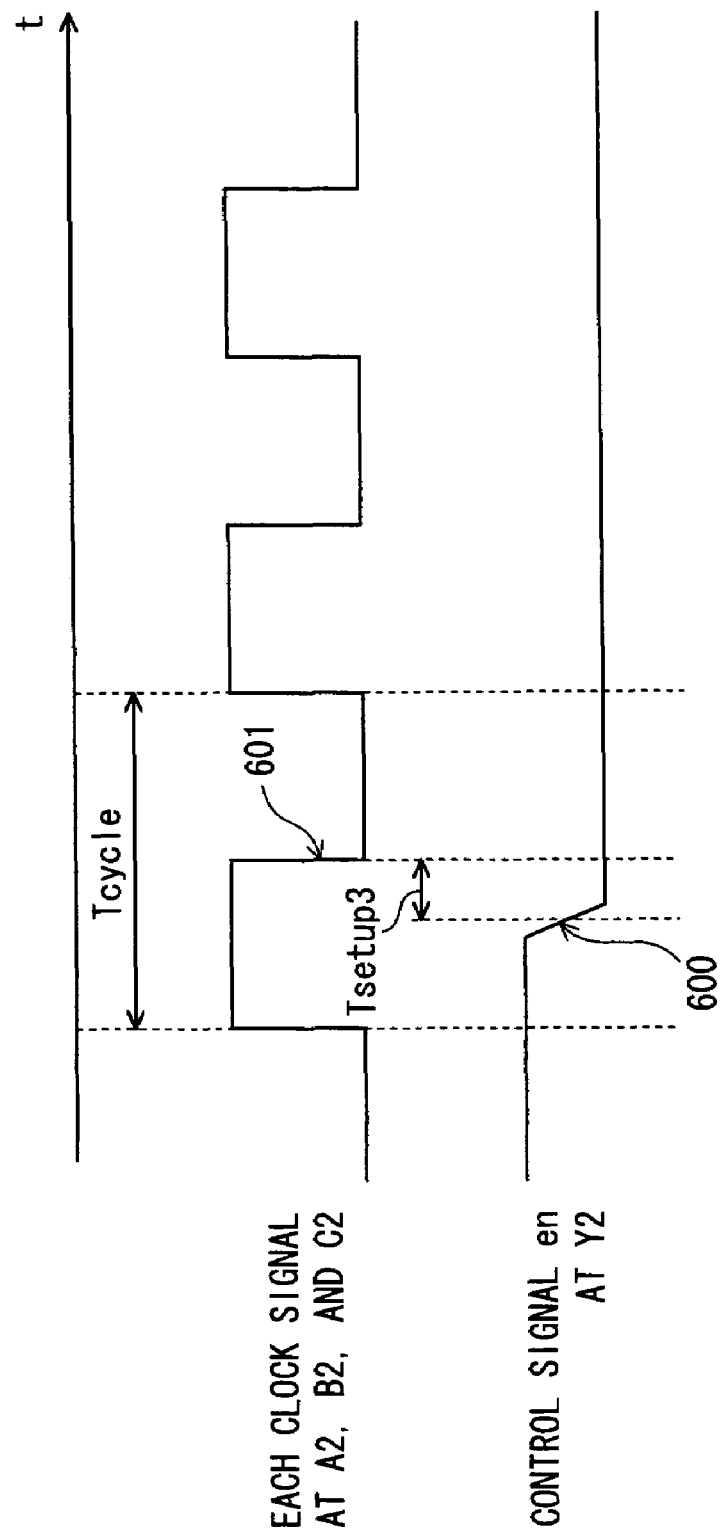
FIG. 6 is a timing chart of each signal at points A2, B2, C2, and Y2 shown in FIG. 4.

FIG. 6 is a timing chart of each signal at points A2, B2, C2, and Y2 shown in FIG. 4.

In detail, clock signal clk is detected at point A2, clock signal clk7 at point B2, clock signal clk6 at point C2, and control signal en at point Y2.

As shown in FIG. 6, a trailing edge 600 of control signal en needs to reach the register 1A at least setup time Tsetup3 before a trailing edge 601 of clock signal clk.

If the trailing edge 600 of control signal en can reach the register 1A at least setup time Tsetup3 before the trailing edge 601 of clock signal clk without changing clock cycle Tcycle, the power consumption of the register 1A can be reduced. In this sense, it is more desirable to use the register 1A than the register 1 as a register circuit subjected to clock signal supply control.

(Consideration)

An allowable range of delay time Ten of control signal en (hereafter "allowable delay range") in each of the synchronous integrated circuit 100 which uses the AND circuit 102 as a gated cell, a synchronous integrated circuit 100A which uses an OR circuit as a gated cell (described later), the synchronous integrated circuit 10 of the first embodiment, and the synchronous integrated circuit 10A of the second embodiment is examined below.

The allowable delay range referred to here is such a range of delay time Ten of control signal en within which a path of control signal en will not be a critical path, i.e. within which clock cycle Tcycle is not affected.

If delay time Ten of control signal en exceeds its allowable delay range, assuming the path of control signal en as a critical path, a designer of a synchronous integrated circuit needs to change clock cycle Tcycle to be larger than the delay of the critical path, that is, needs to decrease an operating frequency of the synchronous integrated circuit.

The synchronous integrated circuit 100A is described first.

Figure 14:
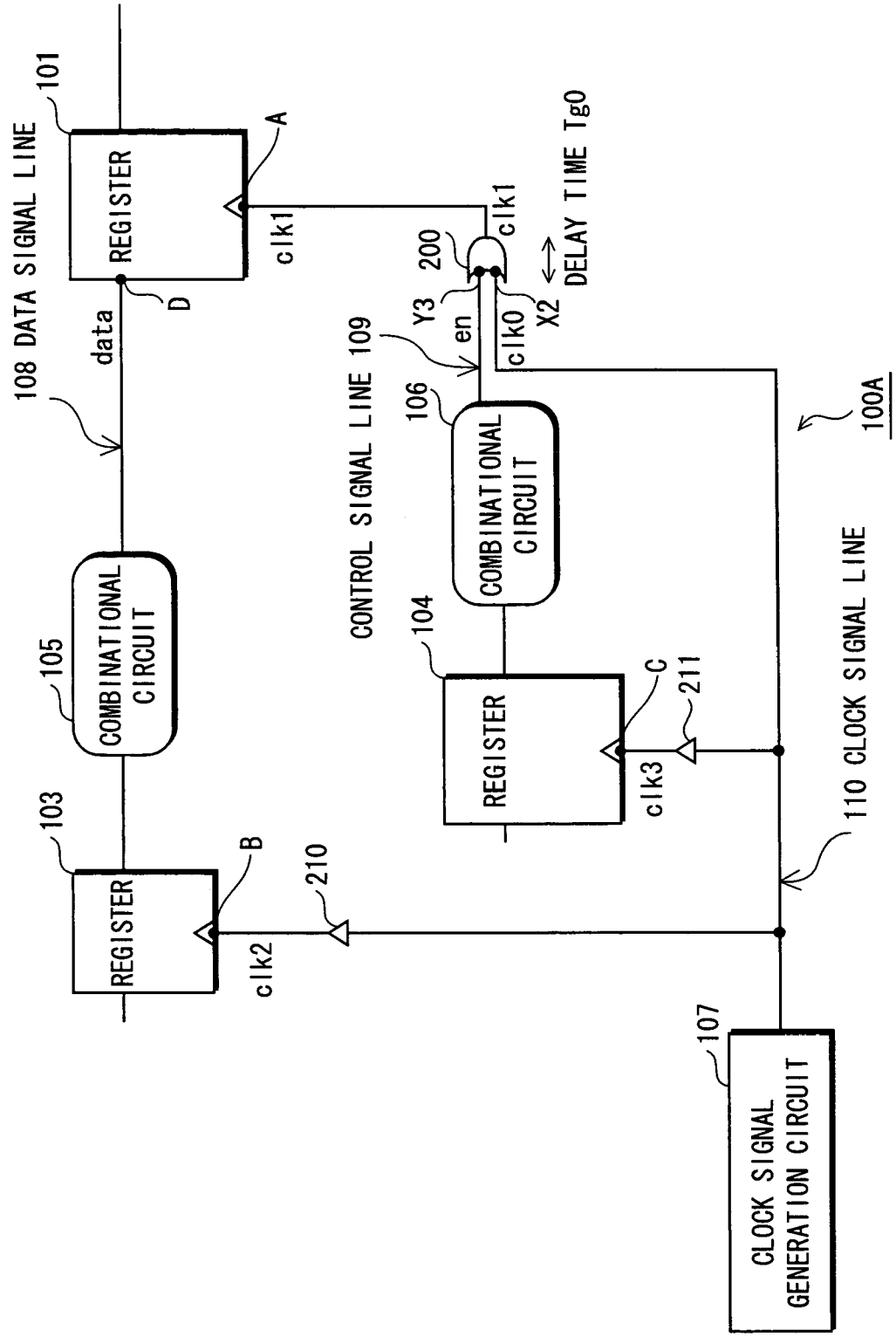
FIG. 14 schematically shows another conventional synchronous integrated circuit.

FIG. 14 schematically shows the synchronous integrated circuit 100A which includes an OR circuit as a gated cell.

The synchronous integrated circuit 100A differs from the synchronous integrated circuit 100 only in that the AND circuit 102 is replaced with an OR circuit 200 and the buffers 112 and 111 are replaced respectively with buffers 210 and 211 used for clock skew adjustment.

The buffer 210 receives clock signal clk0 output from the clock signal generation circuit 107, and outputs clock signal clk2 to the register 103.

The buffer 211 receives clock signal clk0 output from the clock signal generation circuit 107, and outputs clock signal clk3 to the register 104.

Control signal en output from the combinational circuit 106 is input to the OR circuit 200 via the control signal line 109.

The OR circuit 200 receives control signal en and clock signal clk0, and outputs clock signal clk1.

This OR circuit 200 has a phase delay of time Tg0 between the signal input and the signal output.

FIG. 15 is a timing chart of each signal at points A, B, C, D, X2, and Y3 shown in FIG. 14.

In detail, clock signal clk1 is detected at point A, clock signal clk2 at point B, clock signal clk3 at point C, data signal data at point D, clock signal clk0 at point X2, and control signal en at point Y3.

As shown in FIG. 15, clock signals clk1, clk2, and clk3 detected respectively at points A, B, and C are in phase with each other as a result of clock skew adjustment.

There is delay time Tg0 between the input of clock signal clk0 to the OR circuit 200 and the output of clock signal clk1 from the OR circuit 200. Therefore, clock signal clk0 leads in phase clock signals clk1, clk2, and clk3 by delay time Tg0.

Data signal data is set so that the beginning 1100 of data to be latched in the register 101 reaches the register 101 at least setup time Tsetup before the leading edge 1101 of clock signal clk1 input to the register 101.

Control signal en is set so that its leading edge 1502 reaches the OR circuit 200 at least setup time Tsetup4 before a trailing edge 1501 of clock signal clk0, in order to keep clock signal clk1 high.

Thus, when control signal en makes an inactive to active transition, the synchronous integrated circuit 100A fixes clock signal clk1 output from the OR circuit 200 at a high state.

When the register 101 receives clock signal clk1 which is held high from the OR circuit 200, the passage control circuit 101a disables passage of data signal data, whereas the passage control circuit 101c enables passage of data signal data.

Accordingly, the master latch circuit stops transitions of data, and as a result the slave latch circuit stops transitions of data too. This contribute to smaller power consumption of the register 101 than in the synchronous integrated circuit 100 where the AND circuit 102 is used as a gated cell.

In this case, however, the leading edge 1502 of control signal en needs to reach the register 101 before the trailing edge 1501 of clock signal clk0, as explained earlier. In other words, control signal en needs to reach the OR circuit 200 at least half of clock cycle Tcycle before control signal en reaches the AND circuit 102 in the synchronous integrated circuit 100.

Figure 7:
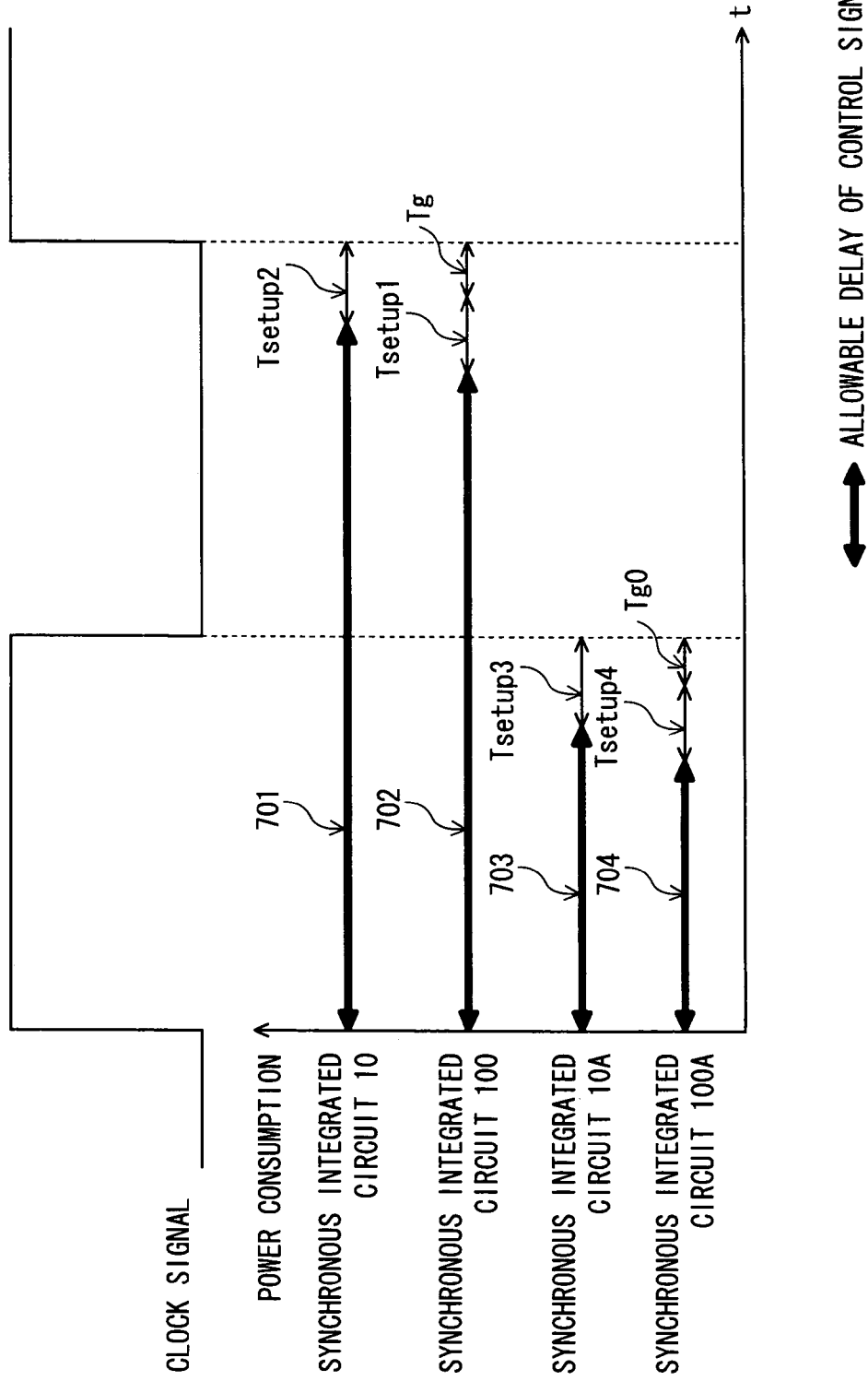
FIG. 7 shows allowable delay ranges of control signal en in different types of synchronous integrated circuits.

FIG. 7 shows an allowable delay range of control signal en in each of the four synchronous integrated circuits having different clock gating structures.

In the drawing, the allowable delay range of control signal en in each synchronous integrated circuit with respect to clock cycle Tcycle is indicated by a heavy-line arrow.

As illustrated, an allowable delay range 701 of the synchronous integrated circuit 10 is largest, followed by an allowable delay range 702 of the synchronous integrated circuit 100, an allowable delay range 703 of the synchronous integrated circuit 10A, and an allowable delay range 704 of the synchronous integrated circuit 10A.

Meanwhile, the register 1 of the synchronous integrated circuit 10 has largest power consumption, followed by the register 101 of the synchronous integrated circuit 100, the register 1A of the synchronous integrated circuit 10A, and the register 101 of the synchronous integrated circuit 10A, though the power consumptions of the registers are not necessarily limited to this order because an absolute value of power consumption varies according to a transition ratio of data signal data.

The register 101 of the synchronous integrated circuit 100A has smaller power consumption than the register 1A of the synchronous integrated circuit 10A, because less power is consumed on a clock line in the register 101 of the synchronous integrated circuit 10A. For the same reason, the register 101 of the synchronous integrated circuit 100 has smaller power consumption than the register 1 of the synchronous integrated circuit 10.

Thus, the four types of synchronous integrated circuits differ in allowable delay range and power consumption of a register that is subjected to clock signal supply control. This being so, a designer of a synchronous integrated circuit can improve an operating frequency and reduce power consumption, by using an optimal clock gating structure according to delay time Ten of control signal en and a required operating frequency and power consumption.

In recent years, cell-based design methods are typically employed for synchronous integrated circuit design. In cell-based design, various logic circuits such as AND circuits, OR circuits, and register circuits are registered in a library as logic cells in advance, so that a designer can choose logic cells from the library and design a synchronous integrated circuit using the chosen logic cells.

The above register 1, register 1A, register 101, AND circuit 102, OR circuit 200, and the like can be registered in such a library as logic cells. By choosing suitable logic cells from this library and using them as components of the synchronous integrated circuit, the designer can optimally use different clock gating structures in different parts. This greatly improves design flexibility and leads to a reduction in design time.

(Modifications)

Though the present invention has been described by way of the above embodiments, it should be obvious that the present invention is not limited to the above. Example modifications are given below.

Figure 8:
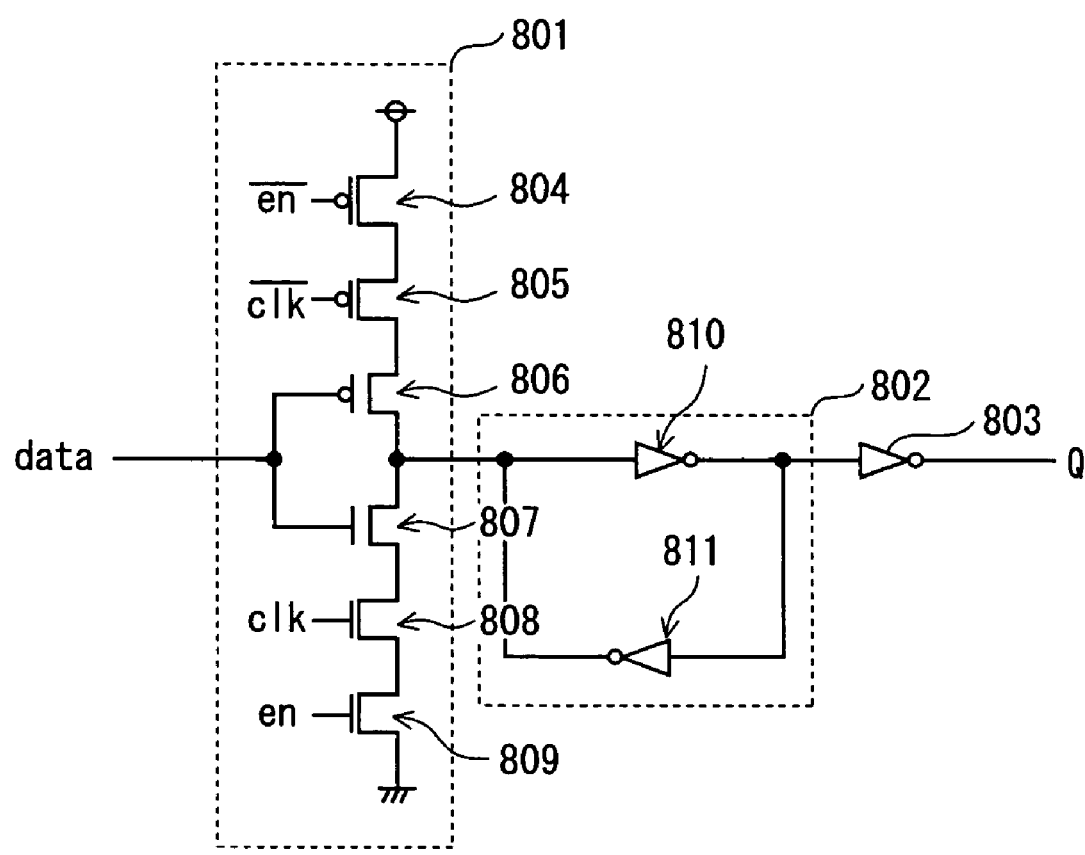
FIG. 8 is a circuit diagram of a register subjected to clock signal supply control, according to a modification of the present invention.

(1) The above embodiments describe the case where the register subjected to clock signal supply control is a master-slave flip-flop circuit, but the present invention is not limited to such. For example, the present invention also includes a register 1B made up of a passage control circuit 801, a holding circuit 802, and an inverter circuit 803 shown in FIG. 8.

The passage control circuit 801 is a CMOS circuit in which source-drain paths of p-channel MOS transistors 804, 805, and 806 and n-channel MOS transistors 807, 808, and 809 are connected in series.

A gate of the p-channel MOS transistor 804 has an input of inverted control signal en-bar.

A gate of the p-channel MOS transistor 805 has an input of inverted clock signal clk-bar.

A gate of the p-channel MOS transistor 806 has an input of data signal data.

A gate of the n-channel MOS transistor 807 has an input of data signal data.

A gate of the n-channel MOS transistor 808 has an input of clock signal clk.

A gate of the n-channel MOS transistor 809 has an input of control signal en.

The passage control circuit 801 differs from the passage control circuit 101f in the first embodiment shown in FIG. 2, in that the p-channel MOS transistor 804 having inverted control signal en-bar as a gate input is located nearest a power source, and the n-channel MOS transistor 809 having control signal en as a gate input is located nearest a ground. The passage control circuit 801 operates in the same way as the passage control circuit 101f.

The holding circuit 802 is formed by connecting inverter circuits 810 and 811 in a loop. Since the holding circuit 802 does not have an input of clock signal clk, there is no need to feed control signal en to the holding circuit 802.

Figure 9:
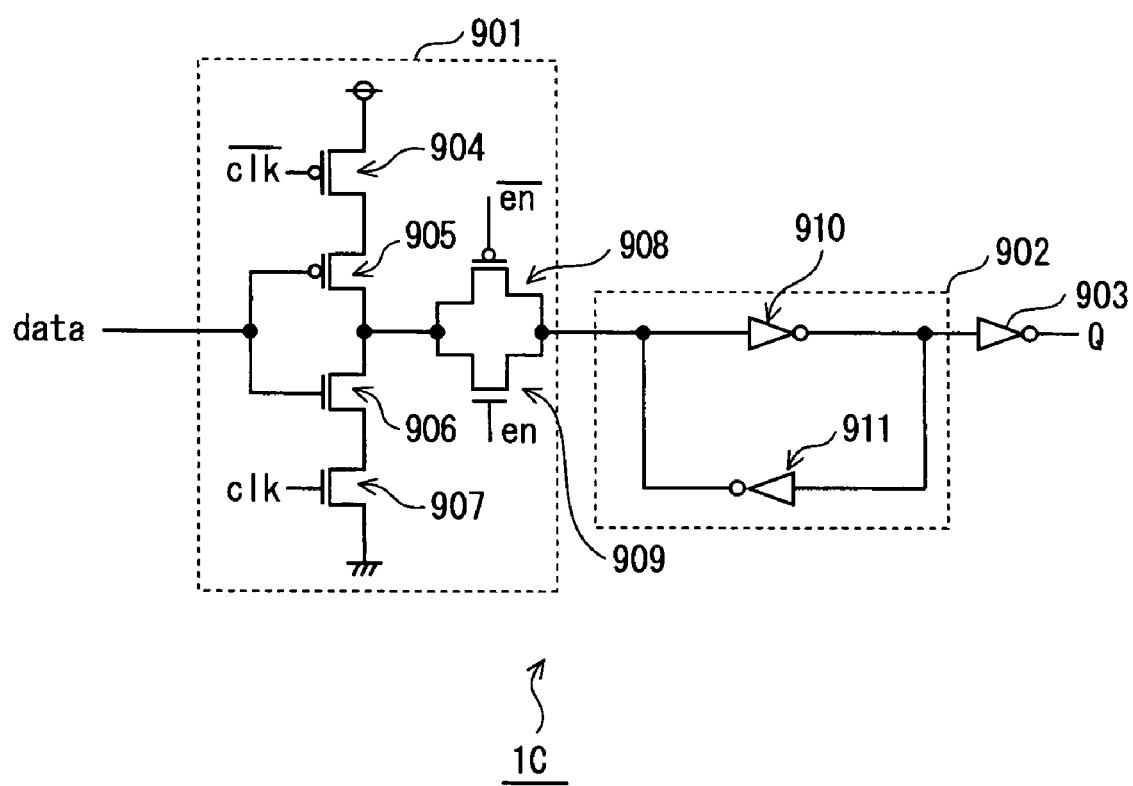
FIG. 9 is a circuit diagram of a register subjected to clock signal supply control, according to another modification of the present invention.

(2) The present invention also includes a register 1C made up of a passage control circuit 901, a holding circuit 902, and an inverter circuit 903 shown in FIG. 9.

The passage control circuit 901 includes a clock inverter in which source-drain paths of p-channel MOS transistors 904 and 905 and n-channel MOS transistors 906 and 907 are connected in series, and a transfer gate made up of a p-channel MOS transistor 908 and an n-channel MOS transistor 909. Here, source-drain paths of the p-channel MOS transistors 904, 905, and 908 are connected in series, and source-drain paths of the n-channel MOS transistors 906, 907, and 909 are connected in series.

A gate of the p-channel MOS transistor 904 has an input of inverted clock signal clk-bar.

A gate of the p-channel MOS transistor 905 has an input of data signal data.

A gate of the n-channel MOS transistor 906 has an input of data signal data.

A gate of the n-channel MOS transistor 907 has an input of clock signal clk.

A gate of the p-channel MOS transistor 908 has an input of inverted control signal en-bar.

A gate of the n-channel MOS transistor 909 has an input of control signal en.

This passage control circuit 901 operates in the same way as the passage control circuit 101f in the first embodiment.

The holding circuit 902 is formed by connecting inverter circuits 910 and 911 in a loop. Since the holding circuit 902 does not have an input of clock signal clk, there is no need to feed control signal en to the holding circuit 902.

(3) The above embodiments describe the case where the p-channel MOS transistor having control signal en as a gate input and the n-channel MOS transistor having inverted control signal en-bar as a gate input in each of the passage control circuits 101f and 101i are located farthest from a power source or a ground. This has an effect of increasing an allowable delay range of control signal en, since the MOS transistor having control signal en or inverted control signal en-bar as a gate input is allowed to have a delay in switch timing with respect to other MOS transistors having clock signal clk and data signal data as gate inputs. This arrangement of MOS transistors is, however, not a limit for the present invention. For example, the MOS transistors may be arranged as in the passage control circuit 801 of the register 1B shown in FIG. 8.

(4) The above embodiments describe the case where the flip-flop circuit is a CMOS circuit, but the flip-flop circuit is not limited to complementary type.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A register circuit comprising a passage control circuit and a holding circuit, wherein
the passage control circuit includes a first transistor having a gate to which a clock signal is input, a second transistor having a gate to which a data signal is input, and a third transistor having a gate to which a control signal is input,
a source-drain path of the first transistor, a source-drain path of the second transistor, and a source-drain path of the third transistor are connected in series, the passage control circuit enables passage of a first data signal input in the passage control circuit to the holding circuit according to a state of the clock signal when the control signal is in a first state that is one of an active state and an inactive state, and disables passage of a second data signal input in the passage control circuit to the holding circuit when the control signal is in a second state that is one of the active state and the inactive state and different from the first state, and when the control signal is in the second state, the holding circuit latches the first data signal passed from the passage control circuit.

2. The register circuit of claim 1, wherein the holding circuit includes a fourth transistor having a gate to which the data signal is input, a fifth transistor having a gate to which the clock signal is input, and a sixth transistor having a gate to which the control signal is input, a source-drain path of the fifth transistor and a source-drain path of the sixth transistor are connected in parallel, and a source-drain path of the fourth transistor and the source-drain path of the fifth transistor are connected in series, and the holding circuit latches the first data signal passed from the passage control circuit when the control signal is in the second state.

3. The register circuit of claim 1, wherein the register circuit comprises a master-slave flip-flop circuit which has a master latch circuit and a slave latch circuit, and wherein the passage control circuit and the holding circuit are included in the slave latch circuit.

4. The register circuit of claim 2, wherein the register circuit comprises a master-slave flip-flop circuit which has a master latch circuit and a slave latch circuit, and wherein the passage control circuit and the holding circuit are included in the slave latch circuit.

5. The register circuit of claim 1, wherein the register circuit comprises a master-slave flip-flop circuit which has a master latch circuit and a slave latch circuit, and wherein the passage control circuit and the holding circuit are included in the master latch circuit.

6. The register circuit of claim 2, wherein the register circuit comprises a master-slave flip-flop circuit which has a master latch circuit and a slave latch circuit, and wherein the passage control circuit and the holding circuit are included in the master latch circuit.

7. The register circuit of claim 1, wherein the source-drain path of the first transistor, the source-drain path of the second transistor, and the source-drain path of the third transistor are connected in series in the stated order, with a drain of the first transistor being connected with a source of the second transistor and a drain of the second transistor being connected with a source of the third transistor.

8. A synchronous integrated circuit comprising:

a register circuit including a passage control circuit and a holding circuit, wherein the passage control circuit includes a first transistor having a gate to which a clock signal is input, a second transistor having a gate to which a data signal is input, and a third transistor having a gate to which a control signal is input, a source-drain path of the first transistor, a source-drain path of the second transistor, and a source-drain path of the third transistor are connected in series, the passage control circuit enables passage of a first data signal input in the passage control circuit to the holding circuit according to a state of the clock signal when the control signal is in a first state that is one of an active state and an inactive state, and disables passage of a second data signal input in the passage control circuit to the holding circuit when the control signal is in a second state that is one of the active state and the inactive state and different from the first state, and when the control signal is in the second state, the holding circuit latches the first data signal passed from the passage control circuit;

a clock signal generation circuit operable to generate the clock signal; and a combinational circuit operable to generate the control signal, wherein the gate of the first transistor in the register circuit is connected with the clock signal generation circuit via a clock signal line, and the gate of the third transistor in the register circuit is connected with the combinational circuit via a control signal line.

9. A synchronous integrated circuit comprising:

register circuits, each of the register circuits including a passage control circuit and a holding circuit, wherein the passage control circuit includes a first transistor having a gate to which a clock signal is input, a second transistor having a gate to which a data signal is input, and a third transistor having a gate to which a control signal is input, a source-drain path of the first transistor, a source-drain path of the second transistor, and a source-drain path of the third transistor are connected in series, the passage control circuit enables passage of a first data signal input in the passage control circuit to the holding circuit according to a state of the clock signal when the control signal is in a first state that is one of an active state and an inactive state, and disables passage of a second data signal input in the passage control circuit to the holding circuit when the control signal is in a second state that is one of the active state and the inactive state and different from the first state, and when the control signal is in the second state, the holding circuit latches the first data signal passed from the passage control circuit, wherein a register circuit out of the register circuits is a master-slave flip-flop circuit which has a master latch circuit and a slave latch circuit, the slave latch circuit including the passage control circuit and the holding circuit, and another register circuit out of the register circuits is a master-slave flip-flop circuit which has a master latch circuit and a slave latch circuit, the master latch circuit including the passage control circuit and the holding circuit;

a clock signal generation circuit operable to generate the clock signal; and combinational circuits corresponding to the register circuits and each of the combinational circuits being operable to generate the control signal for a corresponding one of the register circuits, herein the gate of the first transistor in each of the register circuits is connected with the clock signal generation circuit via a clock signal line, and the gate of the third transistor in each of the register circuits is connected with a corresponding one of the combinational circuits via a control signal line.

* * * * *